United States Patent [19]
Aoki

[11] Patent Number: 5,242,666
[45] Date of Patent: Sep. 7, 1993

[54] APPARATUS FOR FORMING A SEMICONDUCTOR CRYSTAL

[75] Inventor: Kenji Aoki, Tokyo, Japan

[73] Assignee: Seiko Instruments Inc., Japan

[21] Appl. No.: 183,140

[22] Filed: Apr. 19, 1988

[30] Foreign Application Priority Data

Apr. 21, 1987 [JP] Japan .................. 62-97959
Apr. 27, 1987 [JP] Japan .................. 62-103699

[51] Int. Cl.$^5$ .................. C30B 35/00; C30B 25/08
[52] U.S. Cl. .................. 422/245; 156/611; 156/612; 156/DIG. 103; 118/723
[58] Field of Search .................. 156/610, 612, 611, 613; 422/245, 247, DIG. 103, DIG. 98; 118/723

[56] References Cited

U.S. PATENT DOCUMENTS

| | | |
|---|---|---|
| 4,181,544 | 1/1980 | Cho .................. 156/DIG. 103 |
| 4,477,311 | 10/1984 | Mimura et al. .................. 156/DIG. 103 |
| 4,493,142 | 1/1985 | Hwang .................. 437/923 |
| 4,569,829 | 2/1986 | Shih .................. 422/247 |
| 4,605,469 | 8/1986 | Shih et al. .................. 422/247 |
| 4,806,321 | 2/1989 | Nishizawa et al. .................. 156/613 |
| 4,824,518 | 4/1989 | Hayakawa et al. .................. 156/613 |
| 4,834,831 | 5/1989 | Nishizawa et al. .................. 156/610 |

FOREIGN PATENT DOCUMENTS

0196897 8/1986 European Pat. Off. .

OTHER PUBLICATIONS

Patent Abstracts of Japan, vol. 11, No. 122 (E-500) [2569], Apr. 16, 1987, Hitachi Ltd.

*Primary Examiner*—Gary P. Straub
*Attorney, Agent, or Firm*—Bruce L. Adams; Van C. Wilks

[57] ABSTRACT

In a semiconductor crystal growth apparatus, a cleaning chamber for cleaning the surface of a substrate is added to the structure consisting of a growth chamber and a preparation chamber. After the substrate is cleaned in the cleaning chamber, an epitaxial layer is grown on the substrate in the growth chamber. The grown epitaxial layer has an excellent crystallinity.

9 Claims, 6 Drawing Sheets

APPARATUS FOR FORMING A SEMICONDUCTOR CRYSTAL

BACKGROUND OF THE INVENTION

1. Field of the Invention

The present invention relates to an apparatus for forming a semiconductor crystal. More particularly, it relates to an apparatus for growing an epitaxial layer on a semiconductor substrate.

2. Description of Prior Art

Cleaning of a substrate surface is essential to grow a high quality single crystal at a low temperature. To accomplish this object, a method has been employed conventionally which forms an oxide film for protecting the substrate surface from contamination on a substrate by use of a chemical cleaning method, and then heats the substrate under ultra-high vacuum to remove the oxide film and to expose the cleaned surface. Cleaning of the surface used to be practiced by use of a vacuum vessel for the crystal growth inside a system as shown in FIG. 1. Referring now to FIG. 1, reference numeral 101 represents a preparation chamber; 102 is a gate valve; 106 and 107 are evacuating units, respectively; 105 is a gas introduction nozzle; 104 is a heater for heating a substrate; and 103 is a growth chamber. Refer, for example, to "Semiconductor Research", Vol. 21, No.5, pp. 101-116 published by Kogyo Chosakai, for an example of such a method.

In a mass-production process wherein cleaning of the surface and crystal growth are repeated inside the same system, the following problems occur if the surface cleaning step and the crystal growth step by an epitaxial growth method are carried out inside the same vacuum vessel. Namely, reaction products at the time of growth attach to the peripheral portions of a substrate heating system inside the vacuum vessel and its wall surface after the epitaxial growth, but since the substrate temperature is generally higher at the time of surface cleaning than at the time of epitaxial growth, the residual components that attach at the time of the epitaxial growth are emitted once again as a gas as shown in FIG. 2 due to thermal influences at a higher substrate temperature at the next cleaning step of the substrate surface and deteriorate the background inside the growth chamber. If the surface is cleaned under such a condition, cleaning of the substrate surface is not sufficient and the quality of the crystal that has been grown drops eventually. In order to avoid this problem in the conventional system, the vacuum chamber after growth must be exhausted for a long time while being baked before carrying out the surface cleaning step of the next substrate, and consequently, mass-producibility of the system drops.

Furthermore, in the case of manufacturing an insulated gate field effect transistor (hereinafter called "MOSFET") having an epitaxial growth layer grown in the growth chamber, the method for manufacturing the MOSFET as shown in FIGS. 3A and 3B has been employed. FIGS. 3A and 3B are sectional views showing the formation steps of an epitaxial growth layer 303 and a gate oxide film 304 in the fabrication process of a MOSFET in accordance with the prior art technique. As shown in FIGS. 3A and 3B, the epitaxial growth layer 303 which forms a channel region is formed on a substrate 301 by use of a semiconductor crystal growth apparatus having a growth chamber and then a gate oxide film 304 is formed on the epitaxial growth layer 303 by use of a thermal oxidation furnace through a chemical washing step. In FIG. 3, the reference numeral 302 indicates a field oxide film.

Generally, it is of importance to improve the interface condition between the channel region and the gate oxide film in order to improve MOSFET performance. In accordance with the prior art technique, however, the formation of the channel region and the formation of the gate oxide are carried out in entirely different systems as described above, and moreover chemical washing is conducted before the formation of the gate oxide film. Therefore, it is likely that impurity ions such as $Na^+$ attach to the channel surface during or after washing or they are incorporated into the oxide film during the thermal oxidation step. This is one of the significant factors for deteriorating the interface condition between the channel and the gate oxide film or the quality of the oxide film.

SUMMARY OF THE INVENTION

The present invention has been developed with a view of eliminating the disadvantages associated with the above prior art.

It is accordingly an object of the present invention to provide an apparatus for forming a semiconductor device, which can cause growth of an epitaxial layer having excellent crystallinity and a gate insulating film having extremely good interface condition.

In accordance with the present invention, there is provided an apparatus for forming a semiconductor device comprising preparation chamber means for putting a substrate into and out of the apparatus, cleaning chamber means for cleaning the surface of the substrate and growth chamber means for forming an epitaxial layer on the cleaning substrate and a gate insulating film on the epitaxial layer.

BRIEF DESCRIPTION OF THE DRAWING

FIGS. 3, 3A and 3B are sectional views showing the formation steps of an epitaxial layer and a gate oxide film in the fabrication process a of MOSFET in accordance with the prior art technique;

DETAILED DESCRIPTION OF THE PREFERRED EMBODIMENTS

Figure 1:
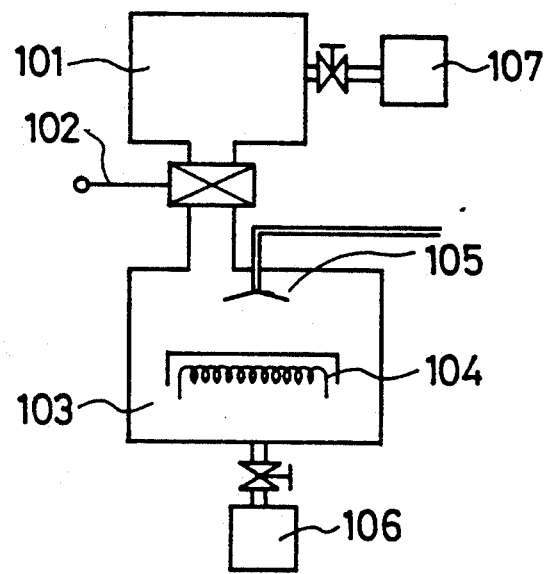
FIG. 1 is a diagrammatic view showing a conventional semiconductor growth apparatus.
Figure 2:
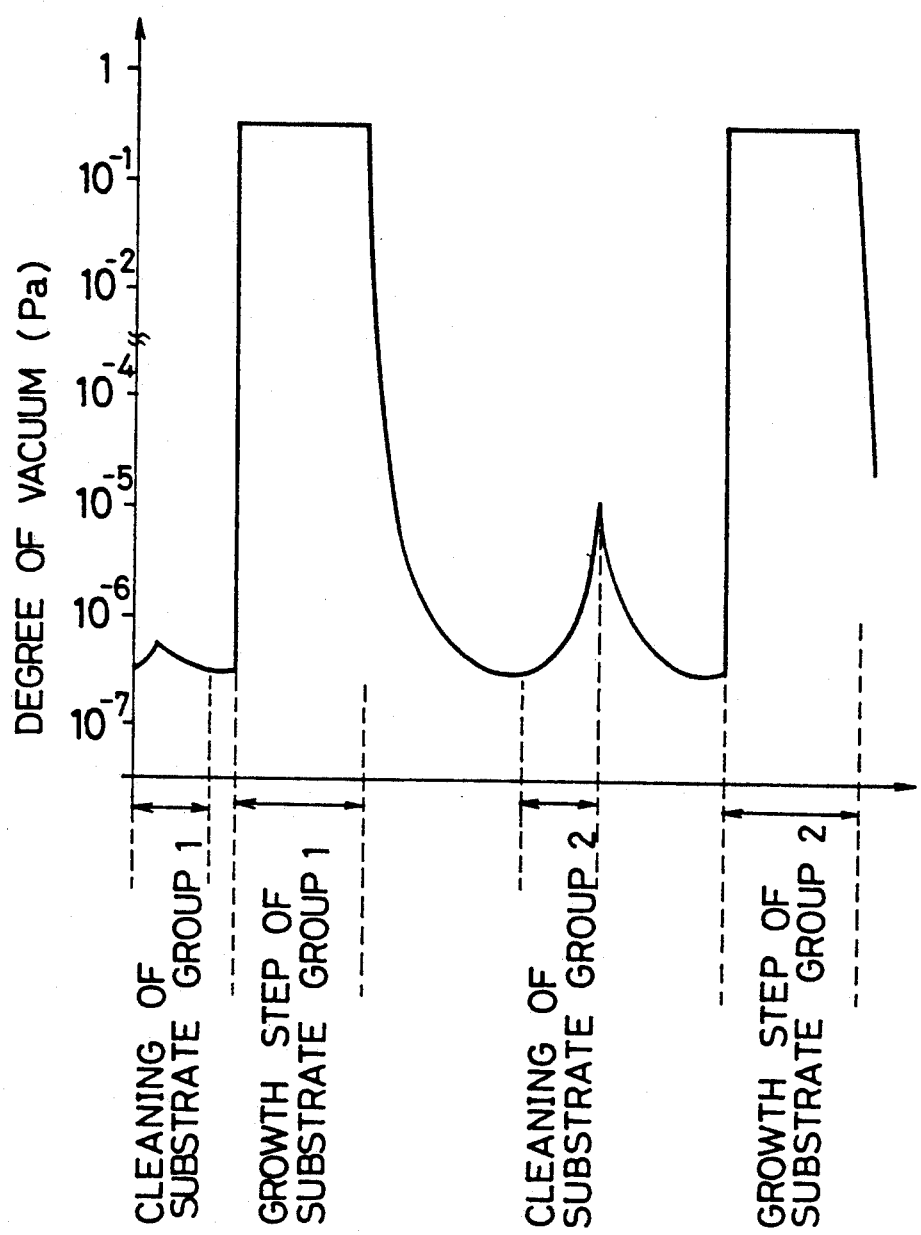
FIG. 2 is a diagram showing the change in vacuum with time in a vacuum vessel (cleaning chamber and growth chamber) of the conventional semiconductor crystal growth apparatus.
Figure 3:
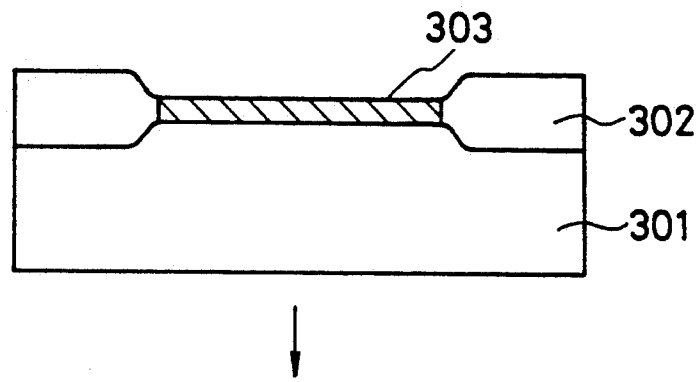
Figure 3:
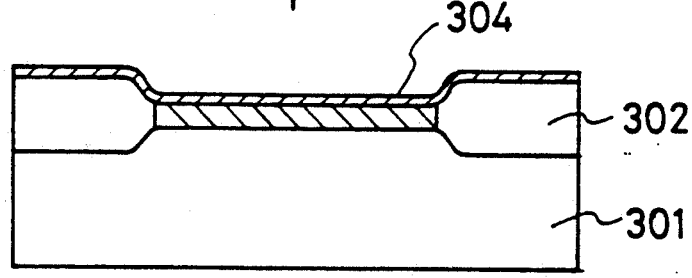
Figure 4:
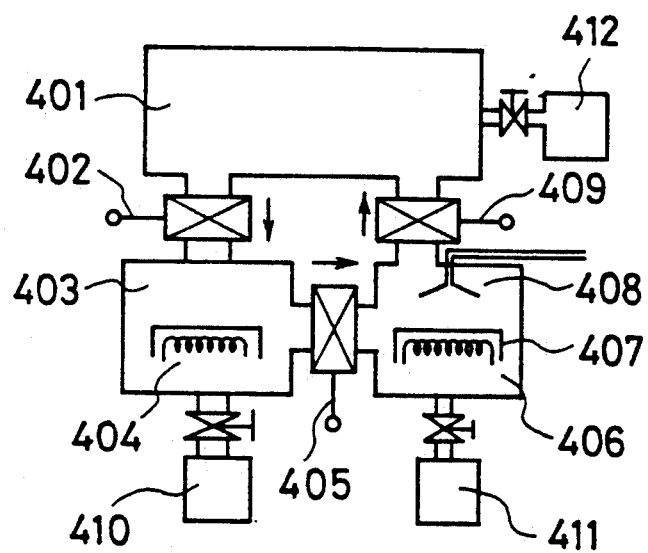
FIG. 4 is a diagrammatic view of a semiconductor crystal apparatus in accordance with an embodiment of the present invention.

In order to solve the problems described above, the present invention disposes additionally a cleaning chamber for cleaning the substrate surface to the structure of the conventional crystal grown system consisting of a growth chamber and a preparation chamber, as shown in FIG. 4. In this manner, surface cleaning can be accomplished with high reproducibility and at the same time, a single crystal thin film having excellent crystallinity can be formed.

Hereinafter, the present invention will be described in detail with reference to an embodiment thereof. FIG. 4 is a structural view of a semiconductor crystal growth system in accordance with an embodiment of the present invention. Reference numeral 401 represents a preparation chamber for putting a substrate into and out of the system; 402 is a gate valve; 403 is a cleaning chamber for cleaning the substrate surface; 404 is a heater for heating the substrate; 405 is a gate valve; 406 is a growth chamber; 407 is a heater for heating the substrate; 408 is a nozzle for introducing material gases and the like; 409 is a gate valve; and 410 to 412 are exhaust systems for evacuating the cleaning chamber, the growth chamber and the preparation chamber to high vacuum, respectively.

The preparation chamber is equipped with an exhaust system capable of attaining vacuum of $1 \times 10^{-5}$ Pa or below, the cleaning chamber is equipped at least with a heater for heating said substrate and with an exhaust system capable of attaining vacuum of $1 \times 10^{-6}$ or below, and the growth chamber is equipped at least with a nozzle for introducing gases onto said substrate, a heater for heating said substrate and an exhaust system capable of attaining vacuum of $1 \times 10^{-5}$ Pa or below.

In the structure described above, a single crystal of a semiconductor such as Si is grown by epitaxial growth method on a substrate at a low temperature in the following manner, for example. Namely, the gate valve 402 is opened and the substrate is put into the cleaning chamber 403 from the preparation chamber 401. The gate valve 402 is then closed. The substrate surface is cleaned by keeping for a predetermined period the condition that the substrate temperature is 850° C. or above and the vacuum at this time is $1 \times 10^{-6}$ Pa, for example (see FIG. 5).

Next, the substrate is transferred from the cleaning chamber 403 into the growth chamber 406 by opening the gate valve 405 and thereafter the gate valve 405 is closed. The epitaxial growth is carried out for a predetermined period under the operation conditions that substrate temperature is from 500° to 800° C., the background pressure inside the growth chamber 406 is up to $1 \times 10^{-6}$ Pa, the pressure inside the growth chamber 406 at the time of introduction of gases is from $1 \times 10^{-3}$ to $1 \times 10^{2}$ Pa and the material gases as well as a gas reactive with the former are introduced either simultaneously or alternatey. After the epitaxial growth is completed, the gate valve 409 is opened and the substrate is transferred from the growth chamber 406 to the preparation chamber 401. Then, the gate valve 409 is closed. An epitaxial layer having excellent crystallinity can be grown at a low temperature with high reproducibility by repeating a series of operations such as described above.

Figure 5:
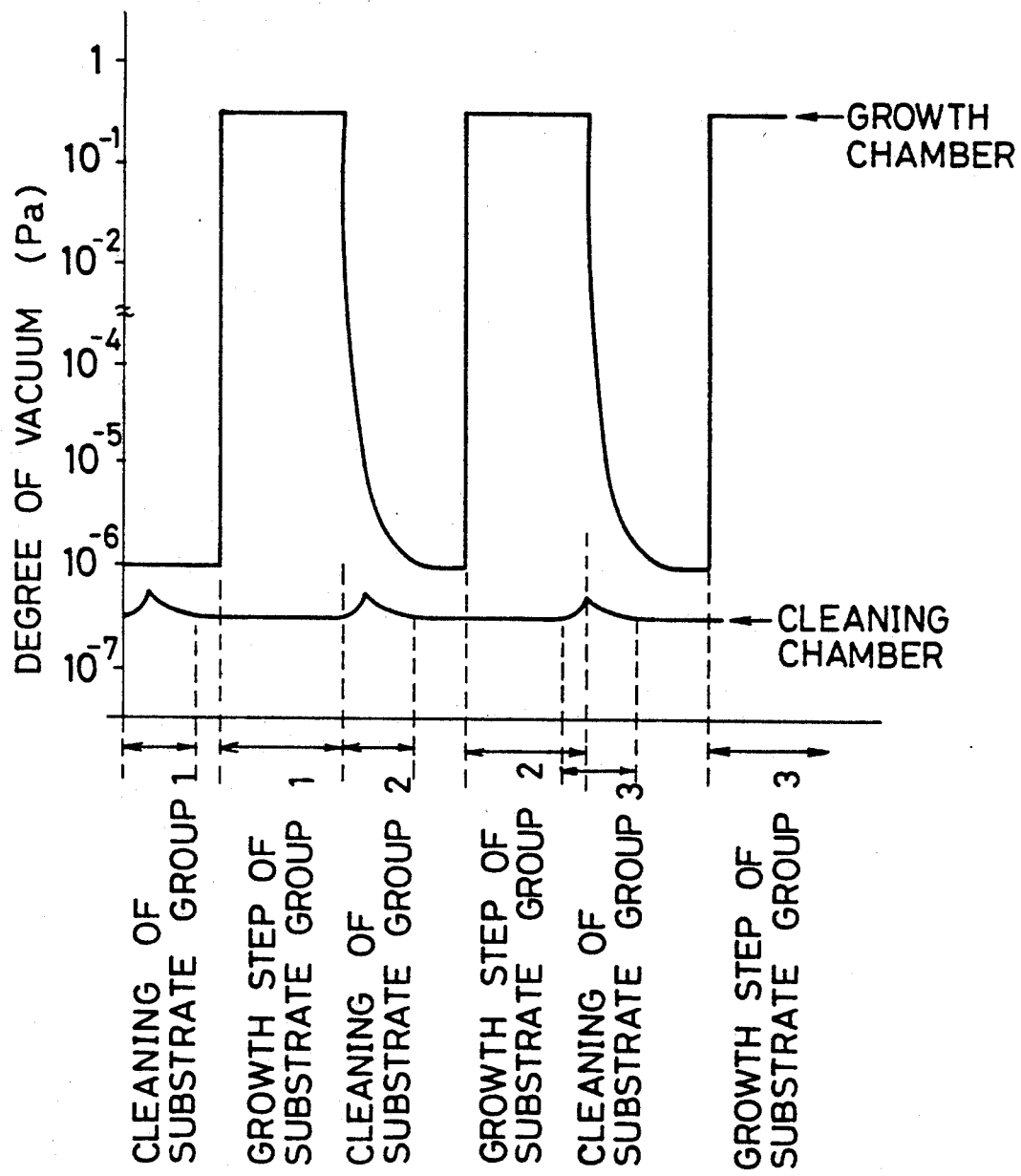
FIG. 5 is a diagram showing the change in vacuum with time in a cleaning chamber and a growth chamber of the apparatus according to the present invention.

In the embodiment described above, the flow of a certain specified substrate inside the crystal growth system in the present invention has been explained. In the mass-production process, at least two substrates are set as one group into each of the preparation chamber 401, the cleaning chamber 403 and the growth chamber 406, and each group moves inside the system in accordance with a series of operations described on the above-mentioned embodiment. In this case, since the atmosphere inside the cleaning chamber 403 is not affected by the atmosphere of the growth chamber 406 in which the growth is repeated, the excellent background as shown in FIG. 5 can be maintained and the surface cleaning step can be carried out with high reproducibility. Therefore, the occurrence of defects at the time of the crystal growth can be reduced and the epitaxial growth can be repeated at a low temperature. Thus, the present invention can grow a high quality single crystal thin film at a low temperature with high reproducibility.

As described above, since the present invention employs a structure wherein a cleaning chamber for cleaning the surface of a substrate is added to the structure consisting of a growth chamber and a preparatory chamber, the present invention can clean or purify the crystal surface with high reproducibility inside a vacuum vessel free from influences of a background after the growth, and can therefore grow an epitaxial growth film having excellent crystallinity. Moreover, the semiconductor crystal growing system of present invention has high mass-producibility that has not been accomplished by the prior art technique.

Particularly when a MOSFET having an epitaxial layer to form a channel region and a gate oxide film is fabricated, it is preferred to employ the structure which is equipped with a mechanism for introducing for forming the channel region of the MOSFET by epitaxial growth and for forming the gate oxide film by CVD an ultrahigh vacuum exhaust system, and which can carry out consecutively the epitaxial growth for forming the channel region and the formation of the gate oxide film inside the same growth chamber under a certain operation condition.

That is, the present embodiment provides an apparatus which grows first the epitaxial growth layer on a semiconductor substrate to form the channel region of the MOSFET and then switches at least one kind of gas among those gases which are used for the growth of the epitaxial growth layer to a gas containing a component element of the insulating film so that the insulating film can be formed on the epitaxial growth layer in succession to the epitaxial growth.

In the present embodiment, the growth chamber comprises heating means for heating the substrate, evacuating means for evacuating the growth chamber to a vacuum of $1 \times 10^{-6}$ Pa or below, nozzle means for introducing gases used for forming the epitaxial layer and the gate oxide film on the substrate into the growth chamber from outside, valve means provided between the nozzle means and sources of the gases and control means for controlling the opening and closing of the valve means according to a predetermined number of cycles of valve opening and closing and a predetermined time of valve opening and closing. According to the present embodiment, since the channel formation step and the gate oxide film formation step can be united to one consecutive step in a clean atmosphere, the gate oxide film having extremely good interface condition can be formed substantially simultaneously with the channel region having excellent crystallinity. The present embodiment can also contribute to the simplification of the fabrication process.

Figure 6:
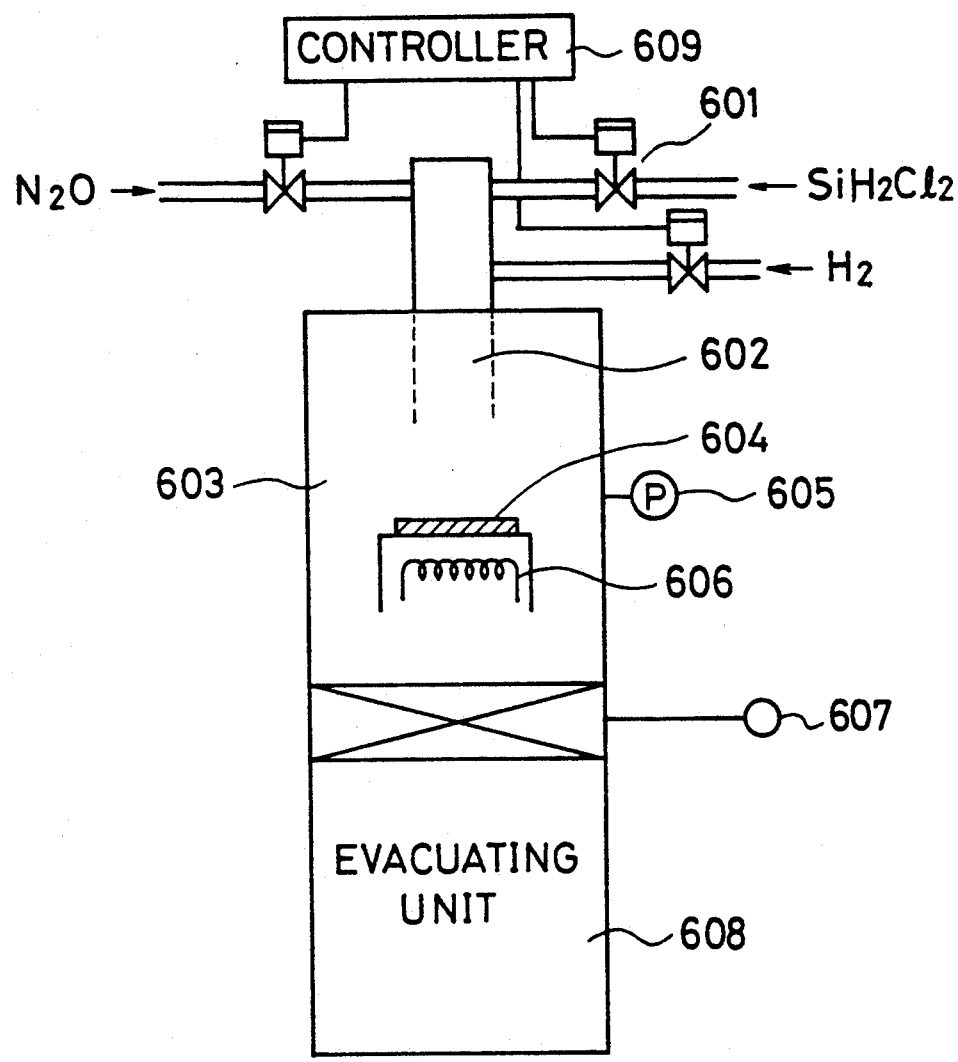
FIG. 6 is a diagrammatic view of a growth chamber in accordance with an embodiment of the present invention.

FIG. 6 is a structural view of a semiconductor fabrication system in accordance with an embodiment of the present invention. Gases used for forming an epitaxial layer and an insulating film are supplied through a valve 601 and a nozzle 602 onto a substrate 604 which is set on a heater 606 inside a growth chamber 603. The growth chamber 603 is evacuated to vacuum by an exhaust unit 608 through a gate valve 607 and the vacuum inside the growth chamber 603 when the gases are not introduced is below $1 \times 10^{-6}$ Pa. The pressure inside the growth chamber 603 is measured by a pressure gauge 605. The opening and closing operations of the valve 601 are controlled by a controller 609.

Figure 7:
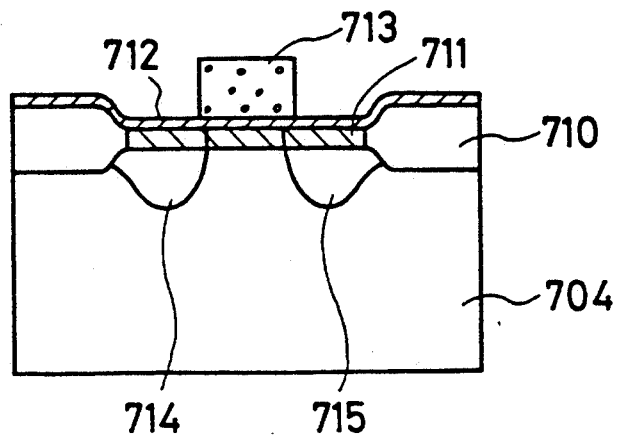
FIG. 7 is a structural sectional view of a MOSFET fabricated by use of the apparatus of the present invention.

An epitaxial growth layer (channel region) 711 and a gate oxide film 712 of a MOSFET shown in FIG. 7 are formed consecutively in the following manner by use of the system having the construction described above. First, in order to form the channel region by the epitaxial growth, the gate valve 402 is opened and the substrate 604 is put into the cleaning chamber 403 from the preparation chamber 401 by of the apparatus as shown in FIG. 4. The gate valve 402 is then closed. The substrate is heated to about 850° C. by the heater 404 and the substrate surface is cleaned. Next, the substrate is sent from the cleaning chamber 403 into the growth chamber 406. The detailed construction of the growth chamber is shown in FIG. 6. In the growth chamber 603 as shown in FIG. 6, the substrate temperature is set to 800° C. and the epitaxial growth is started.

The species of gases used in this case are dichlorosilane ($SiH_2Cl_2$) and hydrogen ($H_2$), for example, and these gases are introduced for a predetermined period within such a range that the pressure inside the growth chamber 603 is from 10 to $1 \times 10^{-3}$ Pa. Though the epitaxial growth proceeds, dichlorosilane and hydrogen are introduced either simultaneously or alternately in this case under a certain predetermined operation condition. Immediately after the single crystal having a desired film thickness has been grown, the introduction of hydrogen among the gases used for the epitaxial growth is stopped and the species nitrous oxide ($N_2O$) is introduced instead and formation of the gate oxide film 712 is then started by use of dichlorosilane and nitrous oxide. In this case, dichlorosilane and nitrous oxide are supplied to the surface of the substrate 604 at the same substrate temperature and the same gas introduction pressure and under the same operation condition as those used for the epitaxial growth for forming the channel, and the insulating film having a desired film thickness can be deposited onto the epitaxial growth layer 711. The gate oxide film thus formed has an extremely low interface charge density and has an excellent dielectric strength distribution.

After the gate oxide film 712 is deposited in the manner described above, source, drain and gate electrodes 714, 715 and 713 are formed to constitute a MOSFET.

In accordance with the formation process of the gate oxide film in the present embodiment, the washing step before the film growth which has been indispensable conventionally becomes entirely unnecessary and various problems that might otherwise occur with washing do not at all occur. Therefore, since the gate oxide film having ideal interface characteristics can formed on the channel having excellent crystallinity, the present invention can improve the performance of switching devices and memory devices based on an MOS structure.

What is claimed is:

1. A semiconductor crystal growth apparatus comprising:
    preparation chamber means for enabling a substrate to be loaded into and unloaded out of the apparatus;
    cleaning chamber means for cleaning the surface of the substrate, the cleaning chamber means communicating with the preparation chamber means so that the substrate can be transferred from the preparation chamber means into the cleaning chamber means;
    growth chamber means for forming an epitaxial layer on the cleaned substrate, the growth chamber means communicating with the cleaning chamber means and the preparation chamber means so that the substrate can be transferred from the growth chamber means directly into the preparation chamber means; and
    a first gate valve provided between the preparation chamber means and the cleaning chamber means, a second gate valve provided between the cleaning chamber means and the growth chamber means, and a third gate valve provided between the growth chamber means and the preparation chamber means.

2. An apparatus according to claim 1; wherein the preparation chamber means includes a first exhaust means for exhausting the preparation chamber means to a vacuum of $1 \times 10^{-5}$ Pa or below; and the cleaning chamber means includes a first heating means for heating the substrate and a second exhaust means for exhausting the cleaning chamber means to a vacuum of $1 \times 10^{-6}$ Pa or below.

3. An apparatus according to claim 2; wherein the growth chamber means includes a second heating means for heating the substrate, a third exhaust means for evacuating the growth chamber means to a vacuum of $1 \times 10^{-6}$ Pa or below, and nozzle means for introducing process gases used for forming an epitaxial growth layer on the substrate into the growth chamber means from outside the growth chamber means.

4. An apparatus according to claim 2; wherein the growth chamber means includes a second heating means for heating the substrate, a third exhaust means for evacuating the growth chamber means to a vacuum of $1 \times 10^{-6}$ Pa or below, nozzle means for introducing process gases used for forming an epitaxial growth layer and an insulating layer on the substrate into the growth chamber means from outside the growth chamber means, valve means for valving the flow of process gases to the nozzle means, and control means for controlling the opening and the closing of the valve means according to a predetermined number of cycles of valve opening and closing and a predetermined time of valve opening and closing, whereby the epitaxial growth layer and the insulating layer to be deposited on the epitaxial growth layer are formed consecutively inside the same growth chamber means.

5. An apparatus according to claim 4; wherein the control means controls the thickness of each of the epitaxial growth layer and the insulating layer formed on the substrate to a precision level on the order of a monoatomic layer.

6. An apparatus for growing semiconductor crystal, comprising: an evacuatable preparation chamber for holding a substrate; an evacuatable cleaning chamber connected to and communicatable with the preparation chamber to enable transfer of the substrate from the preparation chamber to the cleaning chamber, the cleaning chamber having means for cleaning the surface of the substrate; an evacuatable growth chamber connected to and communicatable with the cleaning chamber to enable transfer of the cleaned substrate from the cleaning chamber to the growth chamber, the growth chamber having means for effecting growth of an epitaxial layer on the cleaned substrate, and the growth chamber being connected to and communicatable with the preparation chamber to enable transfer of the epitaxial-layered substrate from the growth chamber directly to the preparation chamber; means for separately evacuating the preparation, cleaning and growth chambers independently of one another; first valve means between the preparation and cleaning chambers for providing communication therebetween when the valve means is open and blocking communication therebetween when the valve means is closed; second valve means between the cleaning and growth chambers for providing communication therebetween when the valve means is open and blocking communicating therebetween when the valve means is closed; and third valve means between the growth and preparation chambers for providing communication therebetween when the valve means is open and blocking communication therebetween when the valve means is closed.

7. An apparatus according to claim 6; wherein the means for cleaning the surface of the substrate includes heating means disposed in the cleaning chamber for heating the substrate.

8. An apparatus according to claim 6; wherein the means for effecting growth of an epitaxial layer on the cleaned substrate includes means for controllably flowing process gases into the growth chamber to form an epitaxial growth layer on the cleaned substrate.

9. An apparatus according to claim 8; wherein the means for controllably flowing comprises means for controllably flowing different species of process gases into the growth chamber to consecutively form an epitaxial growth layer on the cleaned substrate and an insulating layer on the epitaxial growth layer.

* * * * *